(12) United States Patent
Chao et al.

(10) Patent No.: US 11,081,548 B2
(45) Date of Patent: Aug. 3, 2021

(54) BIPOLAR TRANSISTOR

(71) Applicant: RichWave Technology Corp., Taipei (TW)

(72) Inventors: Chuan-Chen Chao, Taipei (TW); Po-Hsiang Yang, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/551,713

(22) Filed: Aug. 26, 2019

(65) Prior Publication Data

US 2020/0168705 A1 May 28, 2020

(30) Foreign Application Priority Data

Nov. 27, 2018 (TW) .................................. 107142265

(51) Int. Cl.
*H01L 29/08* (2006.01)
*H01L 29/737* (2006.01)

(52) U.S. Cl.
CPC ...... *H01L 29/0817* (2013.01); *H01L 29/7371* (2013.01)

(58) Field of Classification Search
CPC ............. H01L 29/0817; H01L 29/7371; H01L 29/0692; H01L 29/41708; H01L 29/7395; H01L 29/0657; H01L 29/0642
See application file for complete search history.

(56) References Cited

U.S. PATENT DOCUMENTS

| 2001/0042867 A1* | 11/2001 | Furuhata | H01L 29/7371 257/197 |
| 2008/0210978 A1* | 9/2008 | Yabu | H01L 27/0266 257/202 |
| 2012/0187538 A1* | 7/2012 | Lin | H01L 29/0821 257/587 |
| 2013/0161638 A1* | 6/2013 | Yao | H01L 29/7787 257/76 |
| 2018/0240898 A1* | 8/2018 | Tao | H01L 29/42304 |
| 2019/0172807 A1* | 6/2019 | Kurokawa | H01L 29/0817 |
| 2020/0168725 A1* | 5/2020 | Kurokawa | H01L 29/7325 |

FOREIGN PATENT DOCUMENTS

TW 201442229 A 11/2014

* cited by examiner

*Primary Examiner* — Stephen M Bradley
*Assistant Examiner* — Wasiul Haider
(74) *Attorney, Agent, or Firm* — Winston Hsu

(57) ABSTRACT

A bipolar transistor includes a collector layer, a base layer on the collector layer, and a first elongated emitter mesa on the base layer having a long side and a short side, wherein the long side is parallel with a first direction, and n separate first emitter-contact structures disposed along the first direction on the first elongated emitter mesa, where n is an integer greater than one.

19 Claims, 10 Drawing Sheets

BIPOLAR TRANSISTOR

CROSS REFERENCE TO RELATED APPLICATION

This application claims priority of Taiwan application No. 107142265 filed on 2018 Nov. 27.

TECHNICAL FIELD

The present invention relates to a bipolar transistor, and more particularly to a heterojunction bipolar transistor (HBT) having separate emitter contact structures.

BACKGROUND

Heterojunction bipolar transistor has been widely used in the field of high-frequency and high-power communication technical fields because of its better linearity and power efficiency. For example, the emitter, base, and collector of a GaAs-based heterojunction bipolar transistor device are generally arranged and stacked in a vertically manner. The electrons in the channel flow in the vertical direction, giving it a higher power density.

However, in a high-power operation, a heterojunction bipolar transistor may have a problem that heat tends to concentrate on the center of the device, which causes nonuniform heat distribution. Once a thermal runaway occurs in certain area, which leads to more current flowing to the area, the current hogging problem is aggravated, causing deterioration or damage to the transistor characteristics. At present, the industry is still seeking a better solution, which can achieve the effect of improving the uniform heat distribution without affecting the output power and increasing the layout area of components.

SUMMARY

It is one object of the present invention to provide an improved bipolar transistor to improve the deficiencies and shortcomings of the prior art described above.

According to one embodiment of the invention, a bipolar transistor includes a collector layer, a base layer on the collector layer, and a first elongated emitter mesa on the base layer having a long side and a short side, wherein the long side is parallel with a first direction, and n separate first emitter-contact structures disposed along the first direction on the first elongated emitter mesa, where n is an integer greater than one. A first conductor layer includes a plurality of contact structures connecting the n separate first emitter contact structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
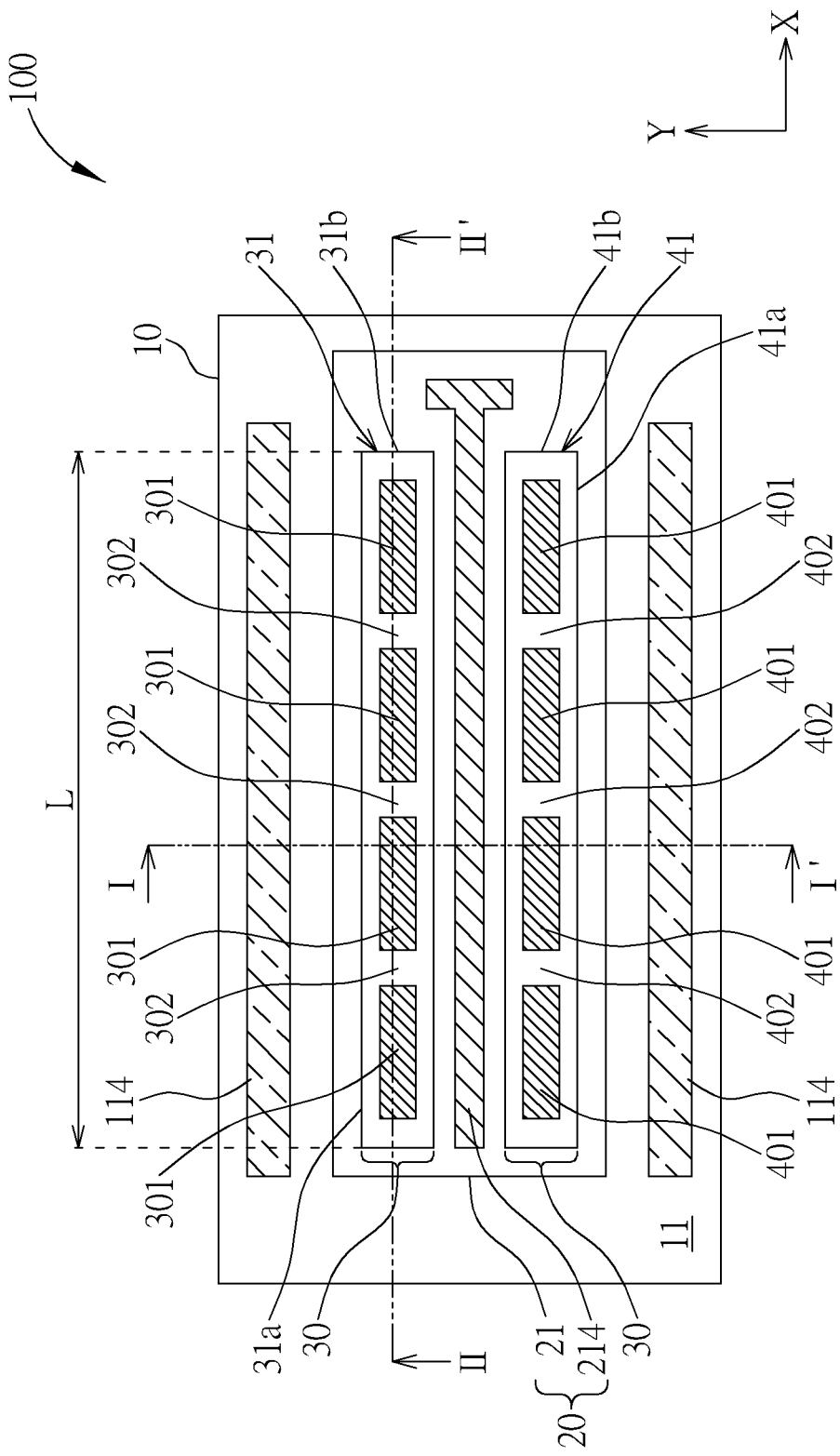
FIG. 1 is a schematic top view of a bipolar transistor according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The present invention relates to a bipolar transistor having separate emitter contact structures disposed in an emitter region. In particular, the present invention pertains to a heterojunction bipolar transistor. The bipolar transistor may be used for power devices in a radio frequency (RF) amplifying circuit for amplifying the RF signal. Although the embodiments described herein are exemplified by gallium arsenide (GaAs), those skilled in the art will appreciate that the bipolar transistor of the present invention may be made by gallium arsenide (GaAs), silicon germanium (SiGe), gallium nitride (GaN) or silicon processes, but is not limited thereto.

Figure 2:
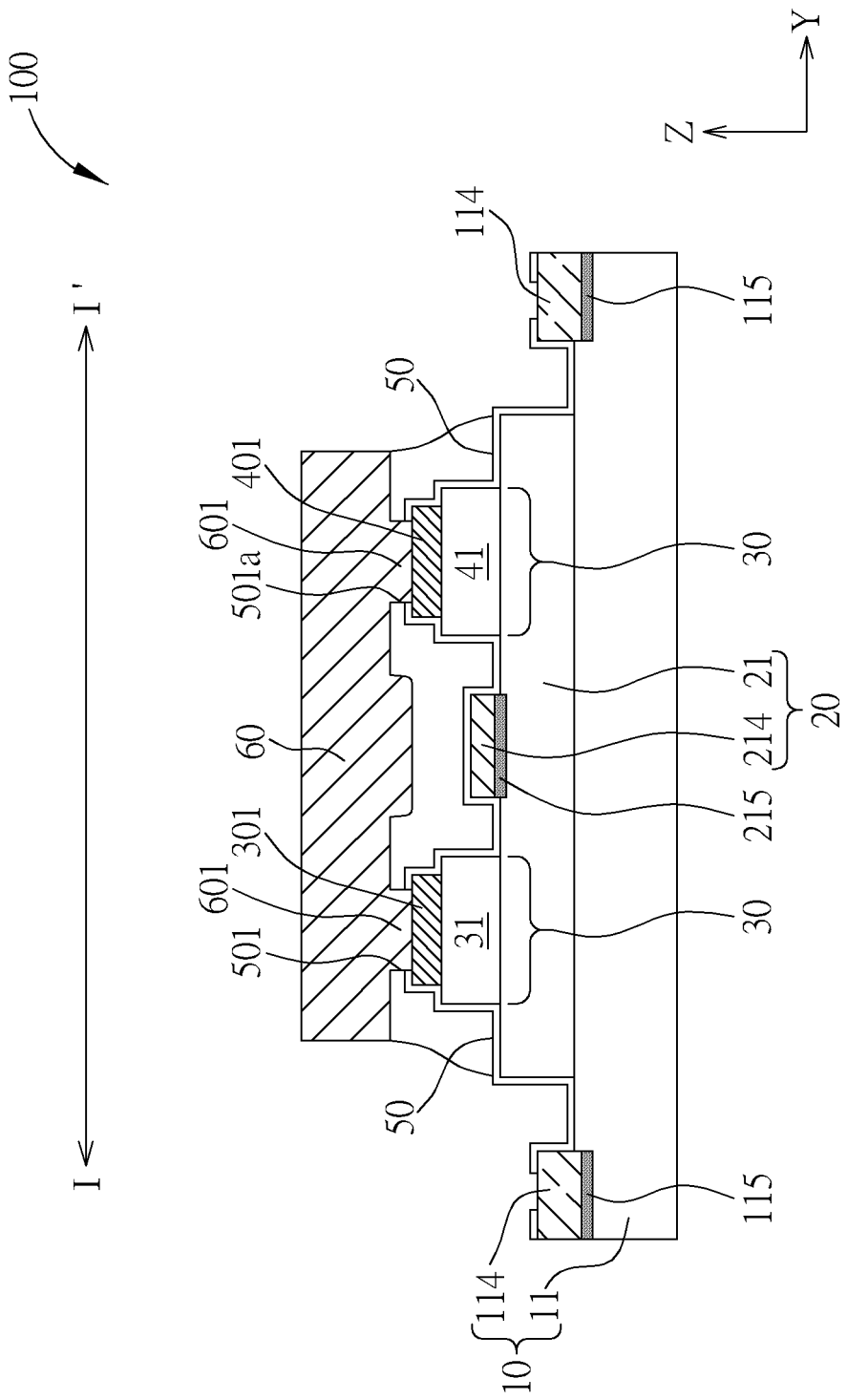
FIG. 2 is a schematic, cross-sectional view taken along I-I' in FIG. 1.
Figure 3:
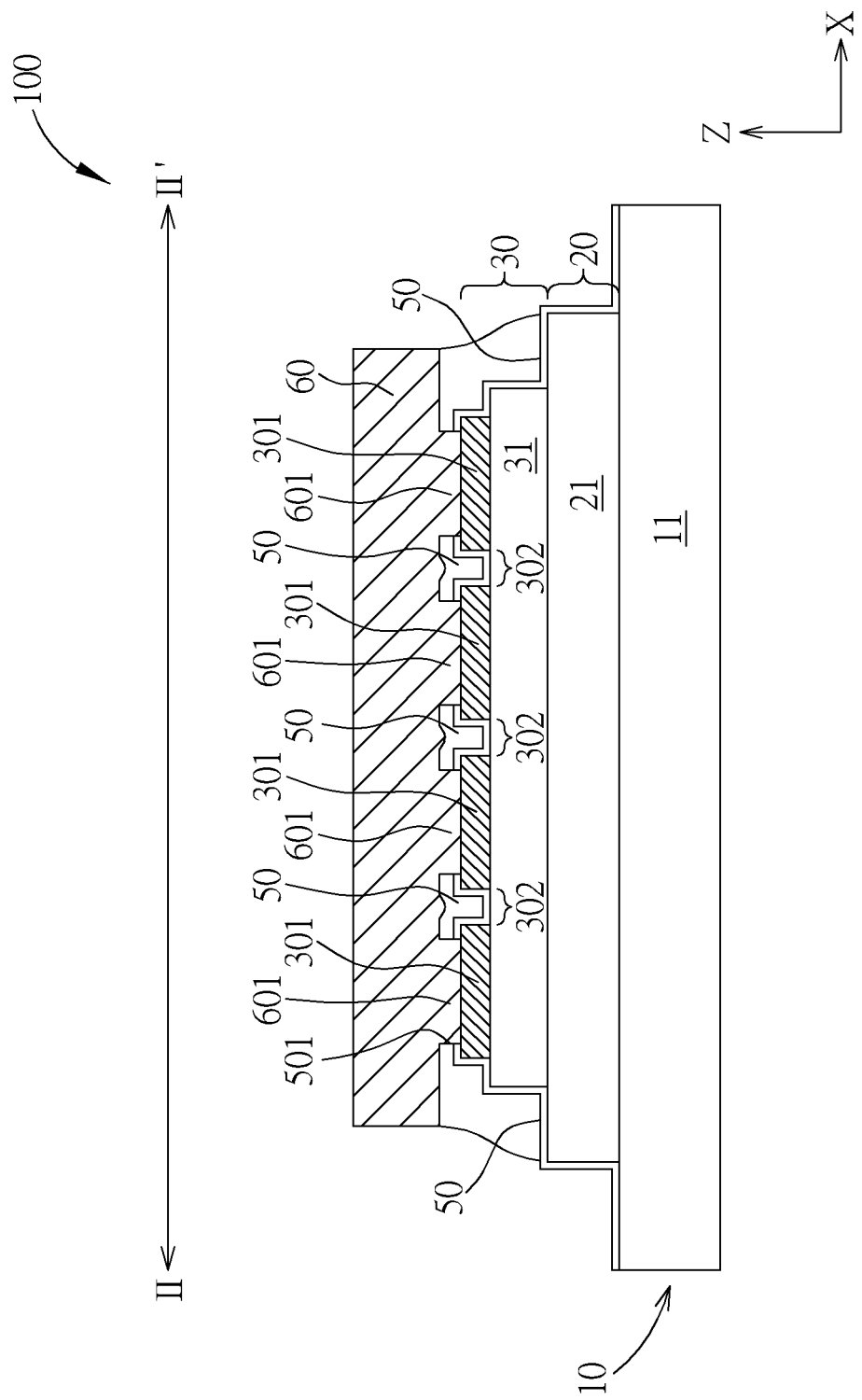
FIG. 3 is a schematic, cross-sectional view taken along line II-II' in FIG. 1.

Please refer to FIG. 1 to FIG. 3. FIG. 1 is a schematic top view of a bipolar transistor according to an embodiment of the invention. FIG. 2 is a schematic, cross-sectional view taken along I-I' in FIG. 1. FIG. 3 is a schematic, cross-sectional view taken along line II-II' in FIG. 1. For convenience of explanation, the metal layer above the emitter region and the base region is not shown in FIG. 1.

As shown in FIG. 1 to FIG. 3, the present invention discloses a bipolar transistor 100 comprising a collector region 10, a base region 20 that is at least partially stacked on the collector region 10, and an emitter region 30 that is at least partially stacked on the base region 20.

According to an embodiment of the invention, the collector region 10 may comprise a collector layer 11 and a collector contact structure 114. The collector contact structure 114 may be disposed on an upper surface of the collector layer 11. According to an embodiment of the invention, the collector layer 11 may comprise an N-type gallium arsenide (GaAs) layer, and the collector contact structure 114 may comprise a heavily doped N-type gallium arsenide layer.

According to an embodiment of the invention, the base region 20 may comprise a base layer 21 and a base metal 214. The base layer 21 is disposed on the collector layer 11 and may comprise a heavily doped P-type gallium arsenide layer, but is not limited thereto. According to an embodiment of the invention, at least a portion of the base metal layer 214 is elongated along a first direction (e.g., reference X-axis direction) and disposed on the base layer 21. The base metal layer 214 and the emitter region 30 are physically isolated from each other. The base layer 21 is provided between the base metal layer 214 and the collector layer 11. According to an embodiment of the invention, the base metal layer 214 may be a T-shaped metal pattern.

As shown in FIG. 2, an ohmic contact layer 115 may be disposed between the collector contact structure 114 and the collector layer 11, and an ohmic contact layer 215 may be disposed between the base metal layer 214 and the base layer 21. According to an embodiment of the invention, the material of the ohmic contact layer 115 and the ohmic contact layer 215 may comprise AuGe/Ni/Au, Ni/Au/Ge, Cr/Au, AuMn, Ti/Pt/Au, or Cr/Pt/Au. According to an embodiment of the invention, the material of the collector contact structure 114 and the base metal layer 214 may comprise Au or Cu, but is not limited thereto.

According to an embodiment of the invention, the emitter region 30 includes an elongated emitter mesa 31 disposed on the base layer 21 of the base region 20 and having a long side 31a and a short side 31b. The long side 31a is parallel to the first direction, and the long side 31a and the short side 31b are perpendicular to each other. According to an embodiment of the invention, n separate emitter contact structures 301 are disposed on the elongated emitter mesa 31 along the first direction, where n is an integer greater than 1 and less than or equal to 6. For example, n=4. The shape of the n emitter contact structures 301 includes a rectangle, a circle, or an ellipse having a thickness.

According to an embodiment of the invention, the emitter contact structures 301 are aligned with one another along the first direction and are arranged in at least one column. The n emitter contact structures have the same length in the first direction. According to another embodiment of the invention, the emitter contact structures 301 are aligned with each other along the first direction and are arranged in only one column.

According to an embodiment of the present invention, n−1 gaps 302 are formed between the n separate emitter contact structures 301 to physically isolate adjacent emitter contact structures 301 such that adjacent emitter contact structures 301 are not in contact with each other. That is, the emitter region 30 further includes n−1 gaps 302, for example, three gaps 302, respectively located between the four emitter contact structures 301.

According to an embodiment of the invention, when n is an integer greater than 1 and less than or equal to 6, the occurrence of thermal runaway can be mitigated, compared to conventional un-separated emitter contact structure, there is no obvious, adverse effect on the electrical characteristics (e.g., gain) and the device operation performance is hardly affected. According to the actual verification results, when n=3 or 4, the effect of mitigating the thermal runaway is better than that of n=2.

According to an embodiment of the invention, the long side 31a has a length L, and the sum of the widths of the n−1 gaps 302 in the first direction is less than L/3. For example, when n is equal to 4, the length L may be about 36 to 37 micrometers, and the width of each of the gaps 302 is about 3 micrometers. With such an arrangement configuration, the heat distribution of the bipolar transistor 100 during operation can be relatively uniform, and it is not easy to concentrate heat at certain area, resulting in heat accumulation.

According to an embodiment of the invention, the bipolar transistor 100 further includes an insulating film 50 disposed on the emitter contact structures 301 and the gaps 302. According to an embodiment of the present invention, the insulating film 50 covers the bottom of the gaps 302, that is, the upper surface of the elongated emitter mesa 31 between adjacent two emitter contact structures 301. The insulating film 50 comprises tantalum nitride, but is not limited thereto. The insulating film 50 comprises n openings 501 that respectively expose the upper surfaces of the n separate emitter contact structures 301.

According to an embodiment of the invention, the bipolar transistor 100 further comprises a conductor layer, such as a metal layer 60, disposed on the emitter region 30. The metal layer 60 comprises a plurality of contact structures, such as metal contact structures 601, connecting the n separate emitter contact structures 301 respectively. The plurality of metal contact structures 601 are electrically connected to the n separate emitter contact structures 301 via the n openings 501 of the insulating film 50. According to an embodiment of the present invention, the material of the metal layer 60 may comprise Au or Cu, but is not limited thereto.

According to an embodiment of the invention, the elongated emitter mesa 31 may comprise an indium gallium phosphide (InGaP) layer, and each emitter contact structure 301 may comprise gold-germanium alloy (AuGe), nickel (Ni) or gold (Au), but is not limited thereto.

When the bipolar transistor 100 is fabricated by a III-V compound fabrication process, the material of the collector layer 11, the base layer 21, and the elongated emitter mesas 31 may comprise GaAs, InGaAs, AlGaAs, InGaP, InP, or GaInP. When the bipolar transistor 100 is fabricated by a GaAs fabrication process, the material of the collector layer 11, the base layer 21, and the elongated emitter mesas 31 may comprise GaAs, InGaAs, or AlGaAs.

Similar to the elongated emitter mesa 31, the emitter region 30 further includes an elongated emitter mesa 41, also provided on the base layer 21 of the base region 20, in accordance with an embodiment of the present invention. At least a portion of the base metal layer 214 is interposed between the elongated emitter mesas 31 and the elongated emitter mesas 41. The elongated emitter mesa 41 has a long side 41a and a short side 41b, and the long side 41a is parallel to a second direction, and the long side 41a and the short side 41b are perpendicular to each other.

According to an embodiment of the invention, m separate emitter contact structures 401 are provided along the second direction on the elongated emitter mesas 41, wherein m is an integer greater than 1 and less than or equal to 6, for example, m=4. According to an embodiment of the invention, wherein n=m, but is not limited thereto.

According to an embodiment of the invention, the emitter contact structures 401 are aligned with each other along the second direction and are arranged in at least one column. According to another embodiment of the invention, the emitter contact structures 401 are aligned with each other along the second direction and are arranged in only one column. In accordance with an embodiment of the invention, the emitter region 30 further includes m−1 gaps 402, for example, three gaps 402, respectively located between the emitter contact structures 401.

According to an embodiment of the invention, the first direction is substantially parallel to the second direction, for example, the first direction and the second direction are both parallel to the reference X-axis direction, and the long side 31a of the elongated emitter mesa 31 and the long side 41a of the elongated emitter mesa 41 have substantially the same length.

Figure 4:
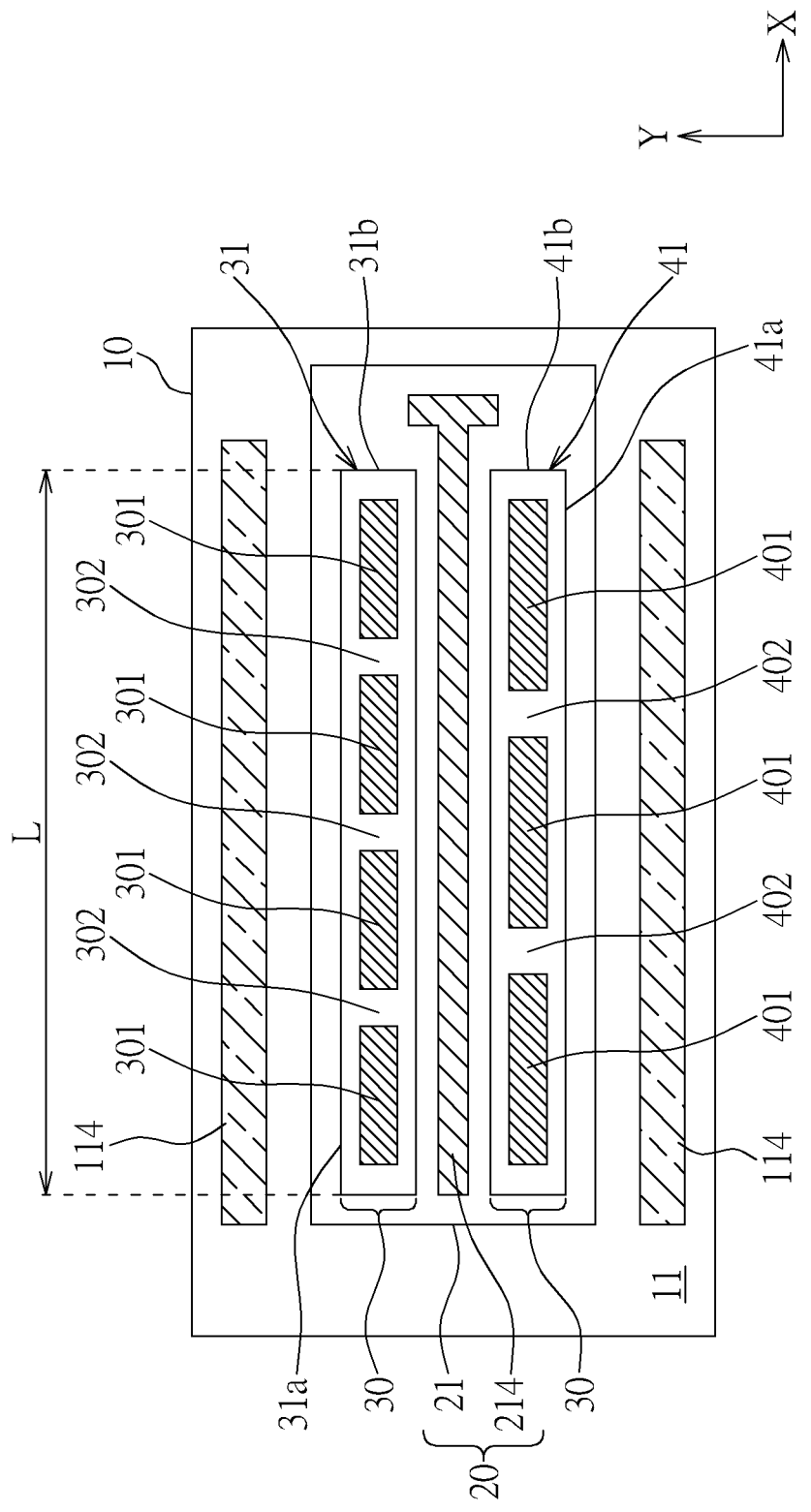
FIG. 4 is a schematic top view of a bipolar transistor according to another embodiment of the present invention.

According to an embodiment of the invention, the n separate emitter contact structures 301 and the m separate emitter contact structures 401 are aligned with each other in a third direction (e.g., reference Y-axis direction). According to another embodiment of the present invention, as shown in FIG. 4, the n separate emitter contact structures 301 and the m separate emitter contact structures 401 may not be aligned with each other in the third direction, but may be mutually staggered. For convenience of explanation, the metal layers above the emitter region and the base region are not shown in FIGS. 4-8.

According to an embodiment of the invention, the insulating film 50 of the bipolar transistor 100 is further disposed on the emitter contact structures 401 and the gaps 402. The insulating film 50 comprises m openings 501a that respectively expose the upper surfaces of the m separate emitter contact structures 401. A plurality of metal contact structures 601 of the metal layer 60 is connected to the m separate emitter contact structures 401.

Figure 2A:
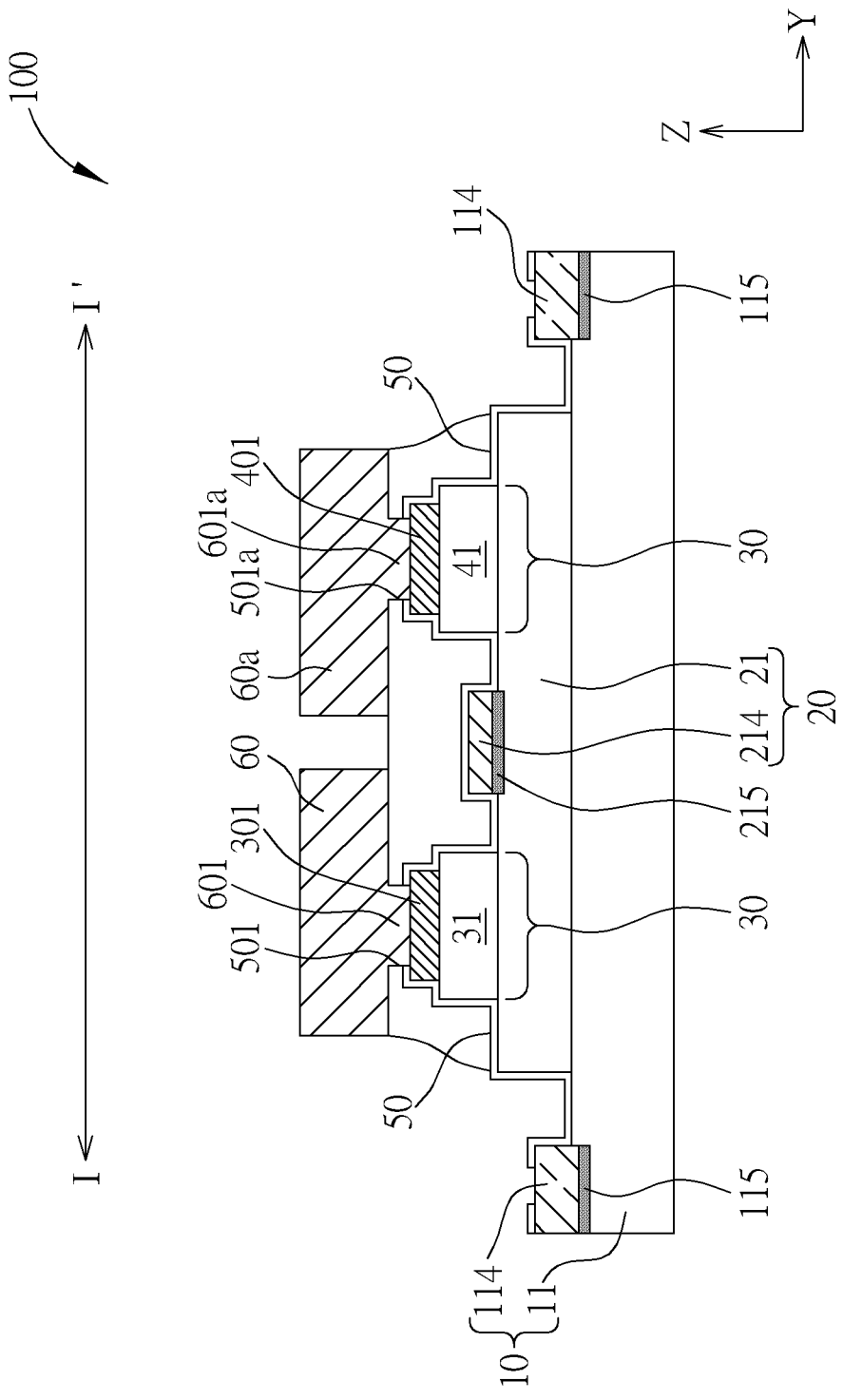
FIG. 2A is a schematic, cross-sectional view taken along I-I' in FIG. 1 according to another embodiment of the invention.

As shown in FIG. 2A, in accordance with another embodiment of the present invention, the bipolar transistor 100 further comprises another conductor layer, such as a metal layer 60a, disposed on the emitter region 30. Similar to the metal layer 60, the metal layer 60a comprises a plurality of contact structures, such as a plurality of metal contact structures 601a, connecting the m separate emitter contact structures 401, and the plurality of metal contact structures 601a are electrically connected to the m separate emitter contact structures 401 via the m openings 501a of the insulating film 50. The metal layer 60 and the metal layer 60a may be isolated from each other and may be further coupled together by a conductor, or the metal layer 60 and the metal layer 60a may be in contact with each other and integrated into a single metal layer as shown in FIG. 2.

Figure 5:
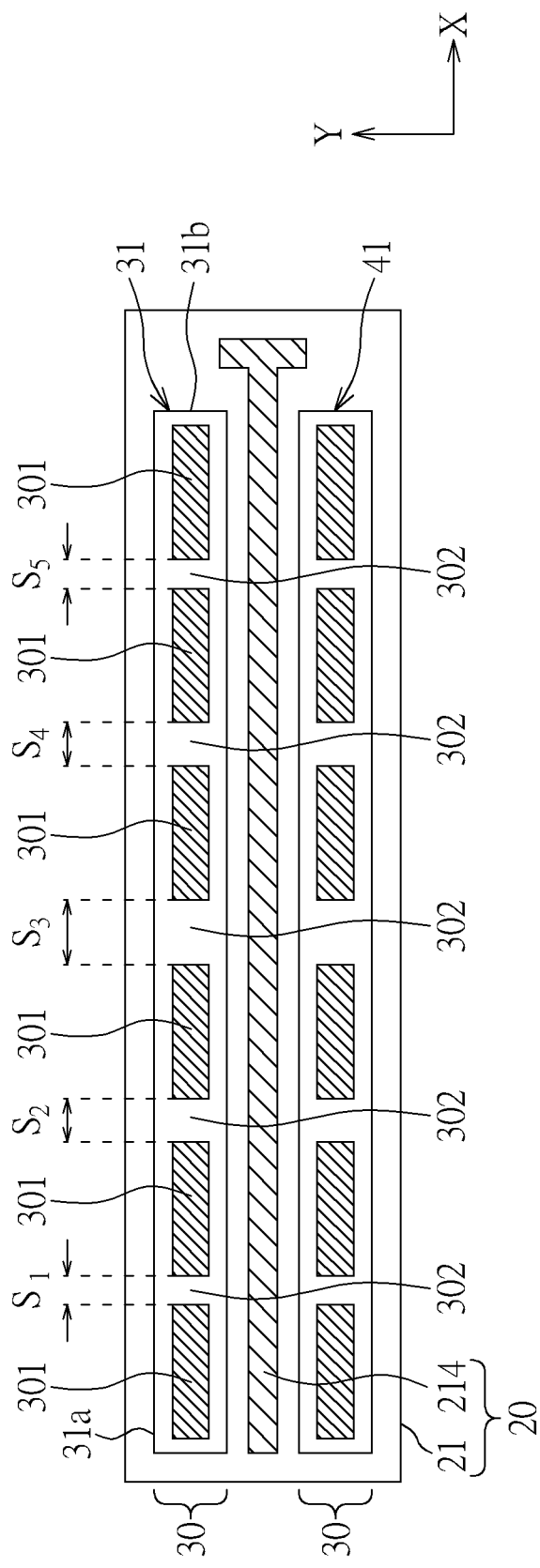
FIG. 5 is an enlarged, schematic top view of an emitter region according to another embodiment of the present invention, showing n separate emitter contact structures and n−1 gaps of the emitter region.

Please refer to FIG. 5, which is an enlarged, schematic top view of an emitter region according to another embodiment of the present invention, showing n separate emitter contact structures and n−1 gaps of the emitter region, wherein like numeral numbers designate like regions, elements or material layers. As shown in FIG. 5, the emitter region 30 comprises an elongated emitter mesa 31 disposed on the base layer 21 of the base region 20, having a long side 31a and a short side 31b, wherein the long side 31a is in parallel to the first direction (e.g., reference X-axis direction).

According to an embodiment of the invention, n separate emitter contact structures 301 are disposed on the elongated emitter mesa 31 along the first direction, where n is an even number greater than or equal to 4, for example, n=6, and there are n−1 gaps 302, for example, five gaps from left to right. The five gaps 302 have five widths $S_1$ to $S_5$ from left to right in the first direction, wherein the width $S_3$ of the (n/2)th gap 302 to the first width $S_1$ of the first gap 302 and/or to the width $S_5$ of the (n−1)th gap 302 is decreasing. In other words, the width $S_3$ of the (n/2)th gap 302 is the largest, and the widths of the gaps sequentially decrease leftward and rightward. The width $S_1$ of the leftmost first gap 302 and the width $S_5$ of the rightmost fifth gap 302 are the smallest. Further, the width $S_2$ may be equal to the width $S_4$, the width $S_1$ may be equal to the width $S_5$, and so on.

Figure 6:
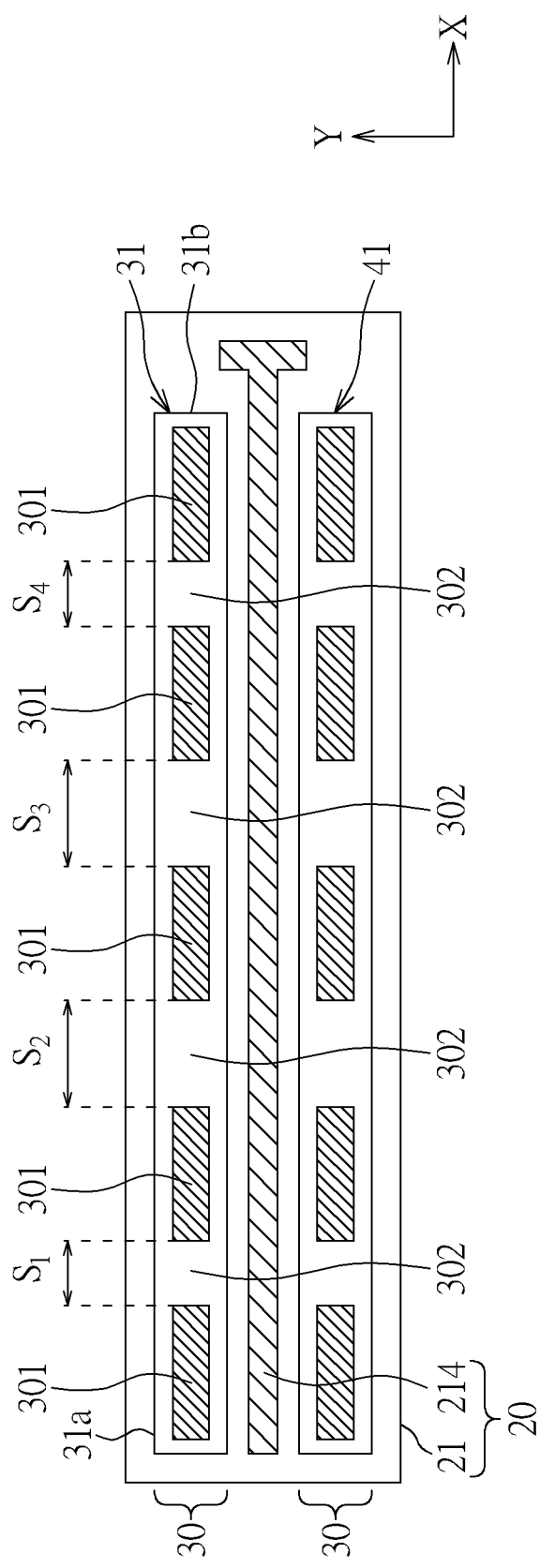
FIG. 6 is an enlarged, schematic top view of an emitter region according to another embodiment of the present invention, showing n separate emitter contact structures and n−1 gaps of the emitter region.

Please refer to FIG. 6, which is an enlarged, schematic top view of an emitter region according to another embodiment of the present invention, showing n separate emitter contact structures and n−1 gaps of the emitter region, wherein like numeral numbers designate like regions, elements or material layers. As shown in FIG. 6, the emitter region 30 comprises an elongated emitter mesa 31 disposed on the base layer 21 of the base region 20, having a long side 31a and a short side 31b, wherein the long side 31a is in parallel to the first direction (e.g., reference X-axis direction).

According to an embodiment of the invention, n separate emitter contact structures 301 are disposed on the elongated emitter mesa 31 along the first direction, where n is an odd number greater than or equal to 4, for example, n=5, and there are n−1 gaps 302, for example, four gaps from left to right. The four gaps 302 have four widths $S_1$ to $S_4$ from left to right in the first direction, wherein the width $S_3$ of the (n/2)th gap 302 to the first width $S_1$ of the first gap 302 and/or to the width $S_4$ of the (n−1)th gap 302 is decreasing. In other words, the width $S_2$ of the ((n−1)/2)th gap 302 and/or the width $S_3$ of the ((n+1)/2)th gap 302 are the largest, and the widths of the gaps sequentially decrease leftward and rightward. Further, the width $S_2$ may be equal to the width $S_3$, the width $S_1$ may be equal to the width $S_4$, and so on.

Figure 7:
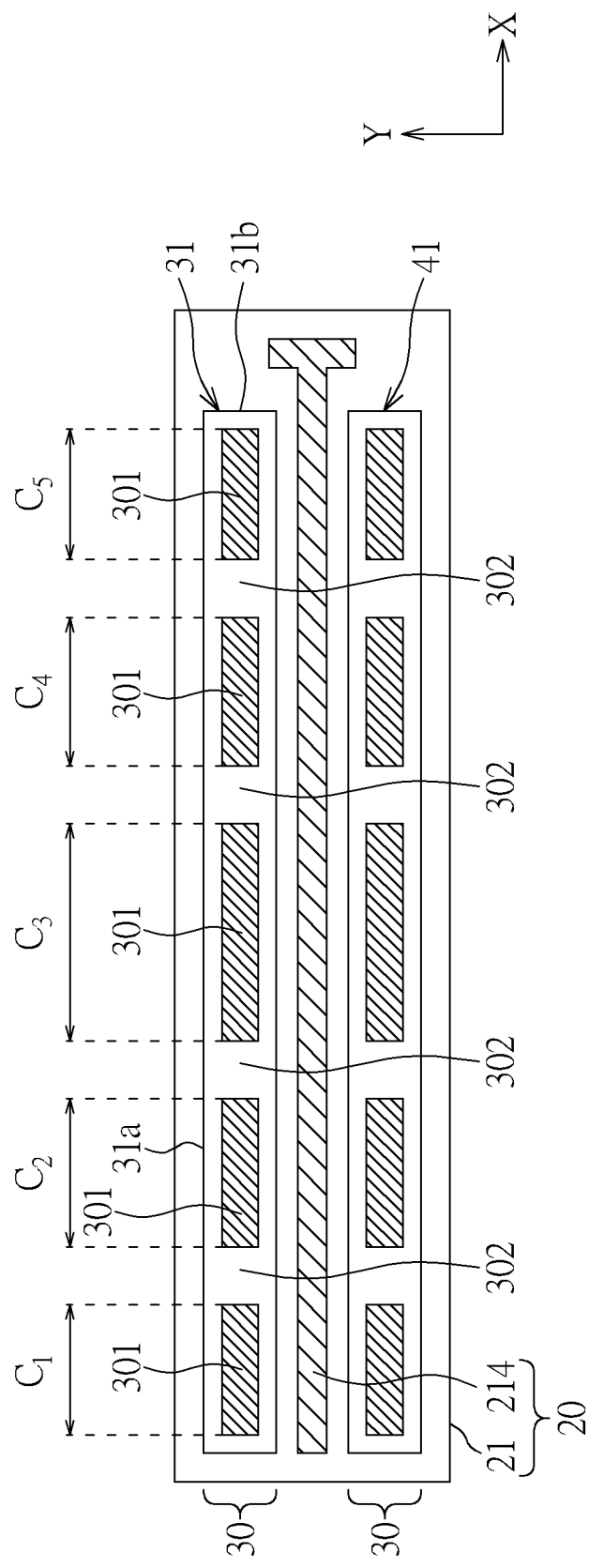
FIG. 7 is an enlarged, schematic top view of an emitter region according to another embodiment of the present invention, showing n separate emitter contact structures and n−1 gaps of the emitter region.

Please refer to FIG. 7, which is an enlarged, schematic top view of an emitter region according to another embodiment of the present invention, showing n separate emitter contact structures and n−1 gaps of the emitter region, wherein like numeral numbers designate like regions, elements or material layers. As shown in FIG. 7, the emitter region 30 comprises an elongated emitter mesa 31 disposed on the base layer 21 of the base region 20, having a long side 31a and a short side 31b, wherein the long side 31a is in parallel to the first direction (e.g., reference X-axis direction).

According to an embodiment of the invention, n separate emitter contact structures 301 are disposed on the elongated emitter mesas 31 along the first direction, where n is an odd number greater than or equal to 3, for example, n=5, and there are n−1 gaps 302, for example, four gaps from left to right. The five emitter contact structures 301 have five lengths $C_1$~$C_5$ in the first direction, respectively, and the length from the length $C_3$ of the ((n+1)/2)th emitter contact structure 301 to the length $C_1$ of the first emitter contact structure 301 and/or the length $C_5$ of the nth emitter contact structures 301 is decreasing. In other words, the length $C_3$ of the ((n+1)/2)th emitter contact structure 301 is the largest, and the length decreases sequentially leftward and rightward. Further, the length $C_2$ may be equal to the length $C_4$, the length $C_1$ may be equal to the length $C_5$, and so on.

Figure 8:
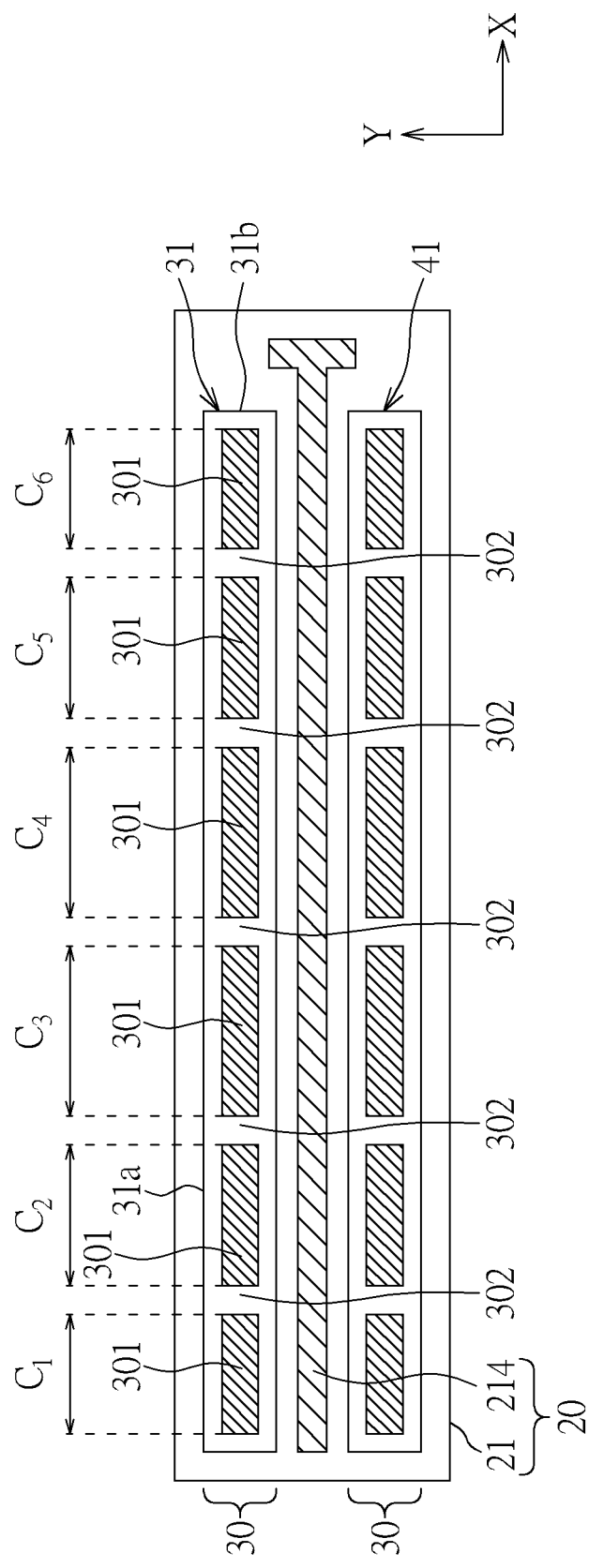
FIG. 8 is an enlarged, schematic top view of an emitter region according to another embodiment of the present invention, showing n separate emitter contact structures and n−1 gaps of the emitter region.

Please refer to FIG. 8, which is an enlarged, schematic top view of an emitter region according to another embodiment of the present invention, showing n separate emitter contact structures and n−1 gaps of the emitter region, wherein like numeral numbers designate like regions, elements or material layers. As shown in FIG. 8, the emitter region 30 comprises an elongated emitter mesa 31 disposed on the base layer 21 of the base region 20, having a long side 31a and a short side 31b, wherein the long side 31a is in parallel to the first direction (e.g., reference X-axis direction).

According to an embodiment of the invention, n separate emitter contact structures 301 are disposed on the elongated emitter mesas 31 along the first direction, where n is an even number greater than or equal to 4, for example, n=6, and there are n−1 gaps 302, for example, five gaps from left to right. The six emitter contact structures 301 respectively have six lengths $C_1$~$C_6$ in the first direction, wherein the length $C_3$ of the third emitter contact structure 301 to the length $C_1$ of the first emitter contact structure 301 is decreasing, and/or the length $C_4$ of the fourth emitter contact structure 301 to the length $C_6$ of the sixth emitter contact structure 301 is decreasing. In other words, the length $C_3$ of the (n/2)th emitter contact structure 301 and the length $C_4$ of the ((n/2)+1)th emitter contact structure 301 are the largest. Further, the length $C_3$ may be equal to the length $C_4$, the length $C_2$ may be equal to the length $C_5$, the length $C_1$ may be equal to the length $C_6$, and so on.

According to an embodiment of the present invention, as shown in FIG. 5 to FIG. 8, similarly to the first elongated emitter mesa 31, the emitter region 30 may further include a second elongated emitter mesa 41, which is also provided on the base layer 21 of the base region 20.

Figure 9:
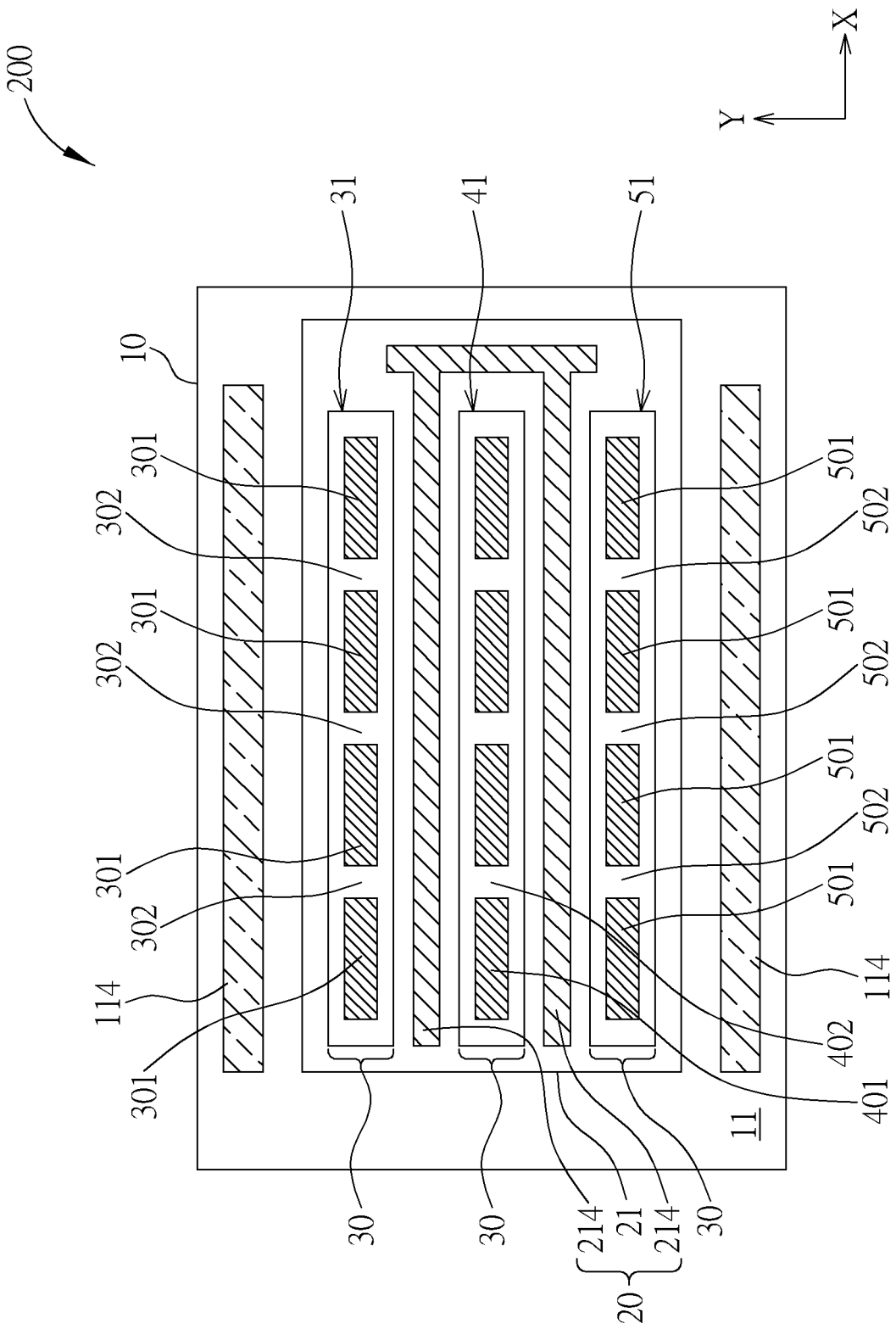
FIG. 9 is a schematic top view of a bipolar transistor according to another embodiment of the present invention.

FIG. 9 is a schematic top view of a bipolar transistor according to another embodiment of the present invention, wherein like numeral numbers designate like regions, elements or material layers. As shown in FIG. 9, likewise, the bipolar transistor 200 comprises a collector region 10, a base region 20 at least partially stacked on the collector region 10, and an emitter region 30 at least partially stacked on the base region 20. The base region 20 comprises a base layer 21 and a base metal layer 214. According to an embodiment of the invention, a portion of the base metal layer 214 and another portion of the base metal layer 214 are elongated and disposed on the base layer 21 along a first direction (e.g., reference X-axis direction). The base metal layer 214 and the emitter region 30 are physically isolated from each other. The base metal layer 214 may be a π-shaped metal pattern.

The emitter region 30 includes three elongated emitter mesas 31, 41 and 51, wherein a portion of the base metal layer 214 and another portion of the base metal layer 214 are disposed between the elongated emitter mesas 31, 41 and 51, respectively. According to an embodiment of the invention, n separate emitter contact structures 301 are disposed on the elongated emitter mesa 31 along the first direction, where n is an integer greater than one and less than or equal to 6, for example, n=4; m separate emitter contact structures 401 are disposed on the elongated emitter mesa 41 along the first direction, where m is an integer greater than one and less than or equal to 6, for example, m=4; and p separated emitter contact structure 501 is disposed on the elongated emitter mesa 51 along the first direction, where p is an integer greater than one and less than or equal to 6, for example, p=4. It is noteworthy that the parameters n, m, p may or may not be equal. In accordance with an embodiment of the invention, the emitter region 30 further comprises n−1 gaps 302, 402, and 502 between the n emitter contact structures 301, 401, and 501, respectively.

The invention can improve the thermal runaway phenomenon of the bipolar transistor during operation by disposing the emitter contact structure in the emitter region in a segmented or broken manner, which does not significantly affect the original operational properties of the bipolar transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar transistor, comprising:
   a collector layer;
   a base layer on the collector layer;
   a first elongated emitter mesa disposed on the base layer having a long side and a short side, wherein the long side is parallel to a first direction;
   n separate first emitter contact structures disposed along the first direction on the first elongated emitter mesa, wherein n is an integer greater than one, wherein n−1 gaps are disposed between the n separate first emitter contact structures, and the long side of the first elongated emitter mesa has a length L, and wherein a sum of the widths of the n−1 gaps in the first direction is less than L/3; and
   a first conductor layer comprising a plurality of contact structures connecting the n separate first emitter contact structures.

2. The bipolar transistor according to claim 1, wherein the bipolar transistor is a heterojunction bipolar transistor.

3. The bipolar transistor according to claim 2, wherein the heterojunction bipolar transistor is a power component for use in a radio frequency amplifying circuit.

4. The bipolar transistor according to claim 1 further comprising an insulating film disposed on the n separate first emitter contact structures, wherein the insulating film comprises n openings respectively exposing upper surfaces of the n separate first emitter contact structures such that the plurality of contact structures of the first conductor layer connect the n separate first emitter contact structures.

5. The bipolar transistor according to claim 1, wherein n is an integer less than or equal to 6.

6. The bipolar transistor according to claim 1 further comprising a base metal layer, wherein at least a portion of the base metal layer is elongated and disposed on the base layer along the first direction.

7. The bipolar transistor according to claim 6 further comprising:
   a second elongated emitter mesa having a long side and a short side, wherein the second elongated emitter mesa is disposed on the base layer, and the long side is parallel to a second direction;
   m separate second emitter contact structures disposed along the second direction on the second elongated emitter mesa, wherein m is an integer greater than one; and
   a second conductor layer comprising a plurality of contact structures connecting the m separate second emitter contact structures;
   wherein said at least a portion of the base metal layer is disposed between the first elongated emitter mesa and the second elongated emitter mesa.

8. The bipolar transistor according to claim 7, wherein the first direction is substantially parallel to the second direction, and the long side of the first elongated emitter mesa has substantially the same length as the long side of the second elongated emitter mesa.

9. The bipolar transistor according to claim 7, wherein n=m.

10. The bipolar transistor according to claim 7, wherein the n separate first emitter contact structures and the m separate second emitter contact structures are aligned with each other.

11. The bipolar transistor according to claim 7, wherein the n separate first emitter contact structures and the m separate second emitter contact structures are not aligned with each other.

12. The bipolar transistor according to claim 1, wherein the n separate first emitter contact structures are aligned with one another along the first direction and are arranged in a column.

13. The bipolar transistor according to claim 1, wherein n−1 gaps are disposed between the n separate first emitter contact structures, and n is an even number greater than or equal to 4, and the n−1 gaps have n−1 widths in the first direction, respectively, wherein a width of (n/2)th gap to a width of first and (n−1)th gaps is decreasing.

14. The bipolar transistor according to claim 1, wherein n−1 gaps are formed between the n separate first emitter contact structures, and n is an odd number greater than 4, and the n−1 gaps have n−1 widths in the first direction, respectively, wherein a width of ((n−1)/2)th gap to a width of first gap and a width of ((n+1)/2)th gap to a width of (n−1)th gap are decreasing.

15. The bipolar transistor according to claim 1, wherein n is an odd number greater than or equal to 3, the n first emitter contact structures respectively having n lengths in the first direction, a length of ((n+1)/2)th first emitter contact structure to a length of first and nth first emitter contact structures is decreasing.

16. The bipolar transistor according to claim 1, wherein n is an even number greater than or equal to 4, the n first emitter contact structures respectively having n lengths in the first direction, and a length of (n/2)th first emitter contact structure to a length of first emitter contact structure is decreasing, and a length of ((n/2)+1)th first emitter contact structure to a length of nth first emitter contact structure is decreasing.

17. The bipolar transistor according to claim 1, wherein the n first emitter contact structures have the same n lengths in the first direction, respectively.

18. The bipolar transistor according to claim 1, wherein a shape of the n first emitter contact structures comprises a rectangle, a circle or an ellipse having a thickness.

19. The bipolar transistor according to claim 1, wherein the bipolar transistor is fabricated by a III-V compound fabrication process, and the collector layer, the base layer, and the first elongated emitter mesa are composed of GaAs, InGaAs, AlGaAs, InGaP, or InP.

* * * * *